(12) United States Patent
Kong et al.

(10) Patent No.: US 11,770,103 B2
(45) Date of Patent: Sep. 26, 2023

(54) PASSIVE MIXER, OPERATING METHOD THEREOF, AND DEVICES INCLUDING THE SAME

(71) Applicant: ELECTRONICS AND TELECOMMUNICATIONS RESEARCH INSTITUTE, Daejeon (KR)

(72) Inventors: Sunwoo Kong, Daejeon (KR); Bong Hyuk Park, Daejeon (KR); Hui Dong Lee, Daejeon (KR); Seunghyun Jang, Daejeon (KR); Seok Bong Hyun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 17/665,405

(22) Filed: Feb. 4, 2022

(65) Prior Publication Data
US 2022/0337192 A1    Oct. 20, 2022

(30) Foreign Application Priority Data

Apr. 15, 2021    (KR) .......................... 10-2021-0049303

(51) Int. Cl.
| | |
|---|---|
| *H03D 7/14* | (2006.01) |
| *H04B 1/18* | (2006.01) |
| *H03D 3/00* | (2006.01) |
| *H04B 1/40* | (2015.01) |

(52) U.S. Cl.
CPC ........... *H03D 7/1441* (2013.01); *H03D 3/009* (2013.01); *H03D 7/1466* (2013.01); *H04B 1/18* (2013.01); *H04B 1/40* (2013.01)

(58) Field of Classification Search
CPC ........ H03D 3/009; H03D 7/14; H03D 7/1425; H03D 7/1441; H03D 7/1466; H04B 1/04; H04B 1/16; H04B 1/1607; H04B 1/1615; H04B 1/18; H04B 1/40; H04B 2001/0408; H04B 2001/0416; H04B 2200/0023; H04B 2200/0074
See application file for complete search history.

(56) References Cited

U.S. PATENT DOCUMENTS

| | | | |
|---|---|---|---|
| 6,275,687 B1 * | 8/2001 | Lloyd | ...................... H04B 1/28 455/323 |
| 8,571,511 B2 | 10/2013 | Goldfarb | |
| 10,855,226 B1 | 12/2020 | Han | |
| 11,533,075 B1 * | 12/2022 | Yu | ............................. H04B 1/48 |
| 2007/0080867 A1 | 4/2007 | Son et al. | |
| 2009/0039943 A1 | 2/2009 | Kim et al. | |

FOREIGN PATENT DOCUMENTS

| KR | 10-20130052315 A | 5/2013 |
|---|---|---|
| KR | 10-1275356 B1 | 6/2013 |

* cited by examiner

*Primary Examiner* — Long Nguyen (57) ABSTRACT

A method and apparatus for input matching of a passive mixer are disclosed. The passive mixer includes a differential transistor pair including a first transistor and a second transistor, a first inductor having one end connected to the first transistor and another end connected to a ground, a second inductor having one end connected to the second transistor and another end connected to a ground, and a third inductor having one end for receiving a radio frequency (RF) signal and another end connected to a ground.

20 Claims, 7 Drawing Sheets

PASSIVE MIXER, OPERATING METHOD THEREOF, AND DEVICES INCLUDING THE SAME

CROSS-REFERENCE TO RELATED APPLICATION

This application claims the benefit of Korean Patent Application No. 10-2021-0049303 filed on Apr. 15, 2021, in the Korean Intellectual Property Office, the entire disclosure of which is incorporated herein by reference for all purposes.

BACKGROUND

1. Field of the Invention

One or more example embodiments relate to a passive mixer, an operating method thereof, and devices including the same.

2. Description of the Related Art

A passive mixer may include a transistor and a gain stage forming a differential pair. The passive mixer may connect a radio frequency (RF) input terminal to an input terminal of a transistor pair and be formed by connecting the gain stage to an output terminal of a transistor pair. The transistor pair may be a switch that serves as an important part in a mixer.

An impedance of the gain stage in the passive mixer may be precisely seen at the RF input terminal. When the passive mixer is used, there may be a tradeoff between input matching and gain stage design.

SUMMARY

Example embodiments provide a passive mixer having a low gain and less tradeoff between input matching and gain stage design, and maintaining high linearity and low noise characteristics.

However, technical tasks to be achieved by the present disclosure are not limited to the above-described technical tasks, and other technical tasks may exist.

According to an aspect, there is provided a passive mixer including a differential transistor pair including a first transistor and a second transistor, a first inductor having one end connected to the first transistor and another end connected to a ground, a second inductor having one end connected to the second transistor and another end connected to a ground, and a third inductor having one end for receiving a radio frequency (RF) signal and another end connected to a ground.

The first inductor, the second inductor, and the third inductor may be each inductively coupled to each other such that three transformers are formed.

The first inductor and the second inductor may be disposed in a direction to increase a mutual inductance.

The first inductor and the second inductor may be equally wound in one of a clockwise direction and a counterclockwise direction.

The passive mixer may further include a gain stage configured to amplify the RF signal.

The first inductor may have the one end connected to a source terminal or a drain terminal of the first transistor.

The second inductor may have the one end connected to a source terminal or a drain terminal of the second transistor.

According to another aspect, there is provided a passive mixer including a differential transistor pair, a ground node connected to a ground, an inductor having one end connected to an input terminal and another end connected to the ground node for receiving a radio frequency (RF) signal, and an additional inductor being magnetically coupled to the inductor such that a transformer is formed and having one end connected to one differential transistor and another end connected to the ground node.

The additional inductor may include a first additional inductor having one end connected to one of the differential transistor pair and another end connected to the ground node, and a second additional inductor having one end connected to an other differential transistor pair and another end connected to the ground node.

The first additional inductor and the second additional inductor may be disposed in a direction to increase a mutual inductance.

The first additional inductor and the second additional inductor may be equally wound in one of a clockwise direction and a counterclockwise direction.

The passive mixer may further include a gain stage configured to amplify the RF signal.

The first additional inductor may have the one end connected to a source terminal or a drain terminal of one of the differential transistor pair.

The second additional inductor may have the one end connected to a source terminal or a drain terminal of an other differential transistor pair.

According to another aspect, there is provided a transceiver for transmitting and receiving a radio frequency (RF) signal including a local oscillator configured to generate a local oscillation signal, and a passive mixer configured to frequency down convert the RF signal in response to the local oscillation signal. The passive mixer may include a differential transistor pair including a first transistor and a second transistor, a first inductor having one end connected to the first transistor and another end connected to a ground, a second inductor having one end connected to the second transistor and another end connected to a ground, and a third inductor having one end for receiving the RF signal and another end connected to a ground.

The first inductor, the second inductor, and the third inductor may be each inductively coupled to each other such that three transformers are formed.

The first inductor and the second inductor may be disposed in a direction to increase a mutual inductance.

The first inductor and the second inductor may be equally wound in one of a clockwise direction and a counterclockwise direction.

The transceiver may further include a gain stage configured to amplify the RF signal.

The first inductor may have the one end connected to a source terminal or a drain terminal of the first transistor.

The second inductor may have the one end connected to a source terminal or a drain terminal of the second transistor.

According to another aspect, there is provided a communication device for transmitting and receiving a radio frequency (RF) signal including a passive mixer. The passive mixer may include a differential transistor pair including a first transistor and a second transistor, a first inductor having one end connected to the first transistor and another end connected to a ground, a second inductor having one end connected to the second transistor and another end connected to a ground, and a third inductor having one end for receiving the RF signal and another end connected to a ground.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

The following structural or functional descriptions of example embodiments described herein are merely intended for the purpose of describing the example embodiments described herein and may be implemented in various forms. However, it should be understood that these example embodiments are not construed as limited to the illustrated forms.

Various modifications may be made to the example embodiments. Here, the example embodiments are not construed as limited to the disclosure and should be understood to include all changes, equivalents, and replacements within the idea and the technical scope of the disclosure.

When it is mentioned that one component is "connected" or "accessed" to another component, it may be understood that the one component is directly connected or accessed to another component or that still other component is interposed between the two components.

Although terms of "first," "second," and the like are used to explain various components, the components are not limited to such terms. These terms are used only to distinguish one component from another component. For example, a first component may be referred to as a second component, or similarly, the second component may be referred to as the first component within the scope of the present disclosure.

Unless otherwise defined herein, all terms used herein including technical or scientific terms have the same meanings as those generally understood by one of ordinary skill in the art. Terms defined in dictionaries generally used should be construed to have meanings matching contextual meanings in the related art and are not to be construed as an ideal or excessively formal meaning unless otherwise defined herein.

Hereinafter, example embodiments will be described in detail with reference to the accompanying drawings. When describing the example embodiments with reference to the accompanying drawings, like reference numerals refer to like components and a repeated description related thereto will be omitted.

Figure 1:
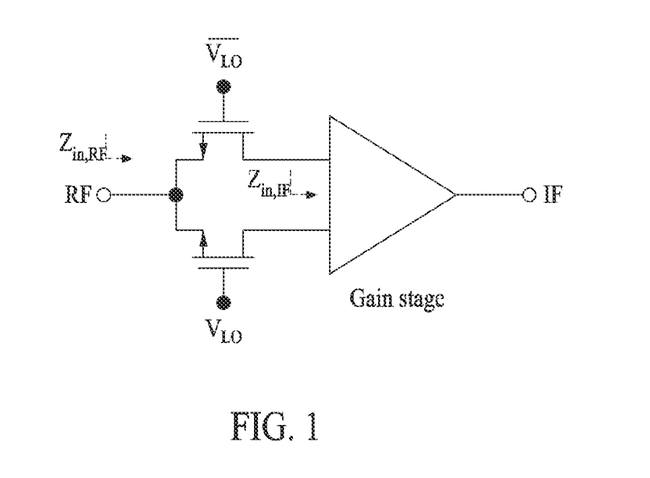
FIG. 1 is a diagram illustrating an example of a structure of a passive mixer according to an example embodiment.

FIG. 1 is a diagram illustrating an example of a structure of a passive mixer according to an example embodiment.

As illustrated in FIG. 1, a typical passive mixer may include a differential transistor pair and a gain stage. A typical passive mixer may be formed by connecting a radio frequency (RF) input terminal to an input terminal of a transistor pair and by connecting a gain stage to an output terminal. A transistor pair may be a switch that serves as an important part in a mixer.

A typical passive mixer may have high linearity and low noise characteristics. A typical passive mixer may have low gain, and an impedance of the gain stage may be seen at the RF input terminal. When the typical passive mixer is used, there may be a tradeoff relationship between input matching and gain stage design.

Figure 2:
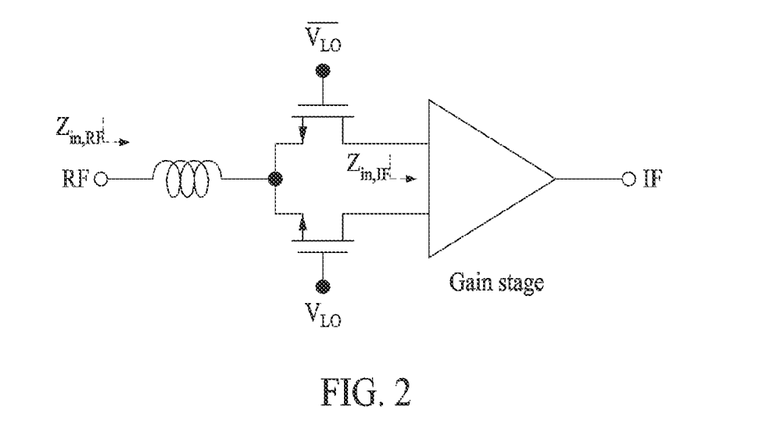
FIG. 2 is a diagram illustrating an example of a structure of a passive mixer according to an example embodiment.

FIG. 2 is a diagram illustrating an example of a structure of a passive mixer according to an example embodiment.

Referring to FIG. 2, an inductor may be added for input matching of a passive mixer. The passive mixer may need an extremely large series inductor. The extremely large series inductor may increase the RF line loss, thereby increasing noise figure (NF) and decreasing gain. A narrow band performance may be induced by series inductor capacitor (LC) resonance matching. Even when a complex matching network is formed, an NF increase and a gain decrease may still occur due to the RF line loss increase.

Figure 3:
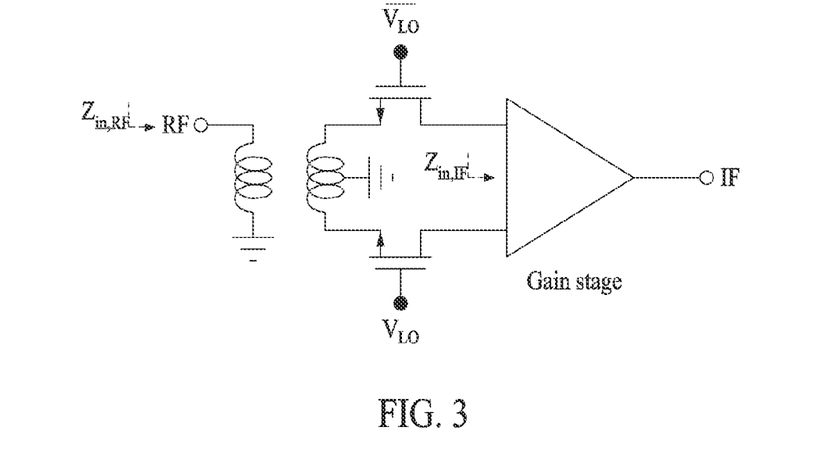
FIG. 3 is a diagram illustrating an example of a structure of a passive mixer according to an example embodiment.

FIG. 3 is a diagram illustrating an example of a structure of a passive mixer according to an example embodiment.

Referring to FIG. 3, a transformer may be added for input matching of a passive mixer. The passive mixer with an added transformer may have a wide band performance. The passive mixer with the added transformer may not operate as a mixer because an output signal is removed due to a signal being in phase at an output terminal of a differential transistor pair.

Figure 4:
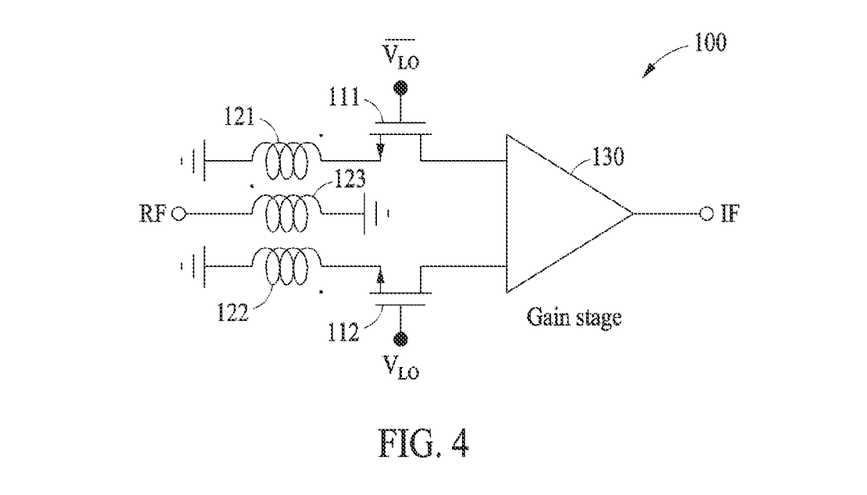
FIG. 4 is a diagram illustrating an example of a structure of a passive mixer according to an example embodiment.

FIG. 4 is a diagram illustrating an example of a structure of a passive mixer according to an example embodiment.

Referring to FIG. 4, the passive mixer 100 may include a first transistor 111, a second transistor 112, a first inductor 121, a second inductor 122, a third inductor 123, and a gain stage 130. The first transistor 111 and the second transistor 112 may be disposed on an input side of the gain stage 130. The first inductor 121 may be disposed on an input side of the first transistor 111. The second inductor 122 may be disposed on an input side of the second transistor 112. The third inductor 123 may be disposed on an input side of the passive mixer 100. The gain stage 130 may be located on an output side of the passive mixer 100.

One end of the first transistor 111 may be connected to the first inductor 121, and another other end may be connected to the gain stage 130. A source terminal or a drain terminal of the first transistor 111 may be connected to the first inductor 121. The first transistor 111 may receive a signal (e.g., RF signal) from the first inductor 121. The first transistor 111 may output the received signal to the gain stage 130.

One end of the second transistor 112 may be connected to the second inductor 122, and another end may be connected to the gain stage 130. A source terminal or a drain terminal of the second transistor 112 may be connected to the second inductor 122. The second transistor 112 may receive a signal (e.g., an RF signal) from the second inductor 122. The second transistor 112 may output the received signal to the gain stage 130.

The first transistor 111 and the second transistor 112 may include a differential transistor pair.

The first inductor 121 may have one end connected to the first transistor 111 and another end connected to a ground (e.g., alternating current (AC) ground or direct current (DC) ground). The first inductor 121 may be inductively coupled to the second inductor 122 and the third inductor 123, respectively. The first inductor 121 that is magnetically coupled to the second inductor 122 and the third inductor 123 may receive a signal (e.g., RF signal) from the second inductor 122 and the third inductor 123.

The second inductor 122 may have one end connected to the second transistor 112 and another end connected to a ground (e.g., AC ground or DC ground). The second inductor 122 may be inductively coupled to the first inductor 121 and the third inductor 123, respectively. The second inductor 122 that is magnetically coupled to the first inductor 121 and the third inductor 123 may receive a signal (e.g., RF signal) from the first inductor 121 and the third inductor 123. The first inductor 121 may output the received signal to the second transistor 112.

The third inductor 123 may have one end connected to an input side of the passive mixer 100 and another end connected to a ground (e.g., AC ground or DC ground). The third inductor 123 may receive a signal (e.g., RF signal). The third inductor 123 may be inductively coupled to the first inductor 121 and the second inductor 122, respectively. The third inductor 123 that is magnetically coupled to the first inductor 121 and the second inductor 122 may transmit the received signal to the first inductor 121 and the second inductor 122.

The first inductor 121 and the second inductor 122 may be disposed in a direction to increase mutual inductance. The first inductor 121 and the second inductor 122 may be equally wound in one of a clockwise direction and a counterclockwise direction. A winding direction of the third inductor 123 may be determined by a user or a supplier of the passive mixer 100. The first inductor 121, the second inductor 122, and the third inductor 123 may be inductively coupled to each other such that three transformers are formed.

One end of the gain stage 130 may be connected to the first transistor 111 and the second transistor 112, and another end may be connected to an output side of the passive mixer 100. The gain stage 130 may amplify the received signal and output the amplified signal to the output side of the passive mixer 100. The gain stage 130 may include an amplifier (e.g., RF amplifier).

Figure 5A:
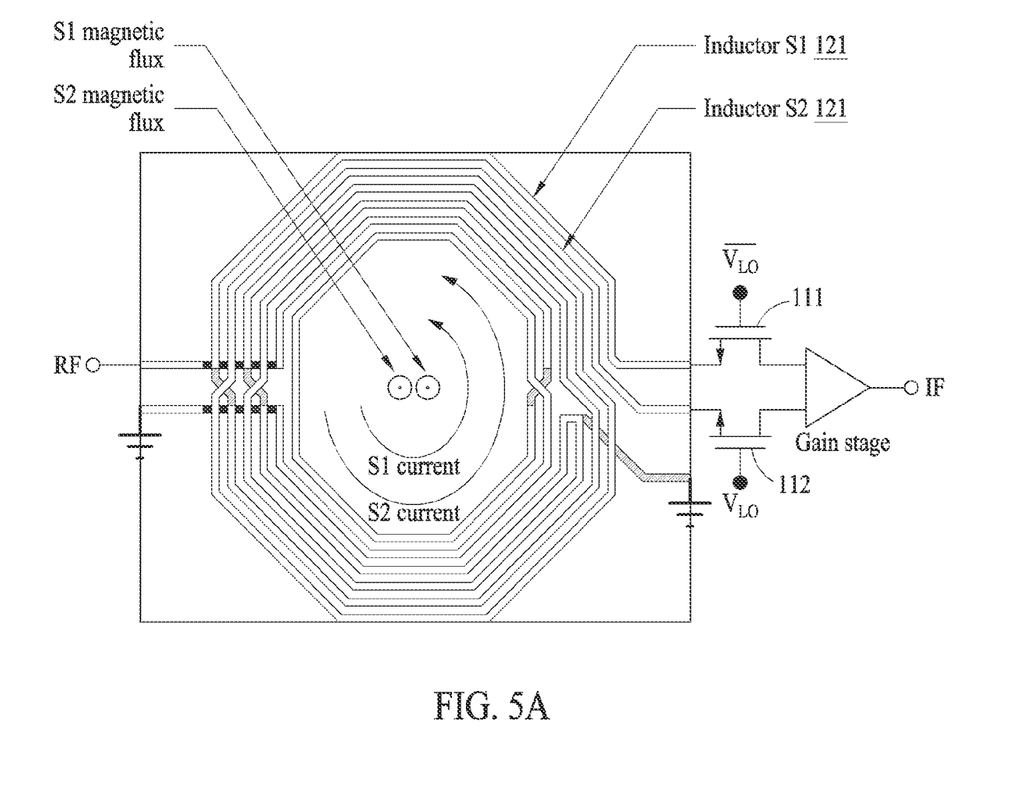
FIG. 5A is a diagram illustrating an example of an operation of a transformer in a passive mixer according to an example embodiment.
Figure 5B:
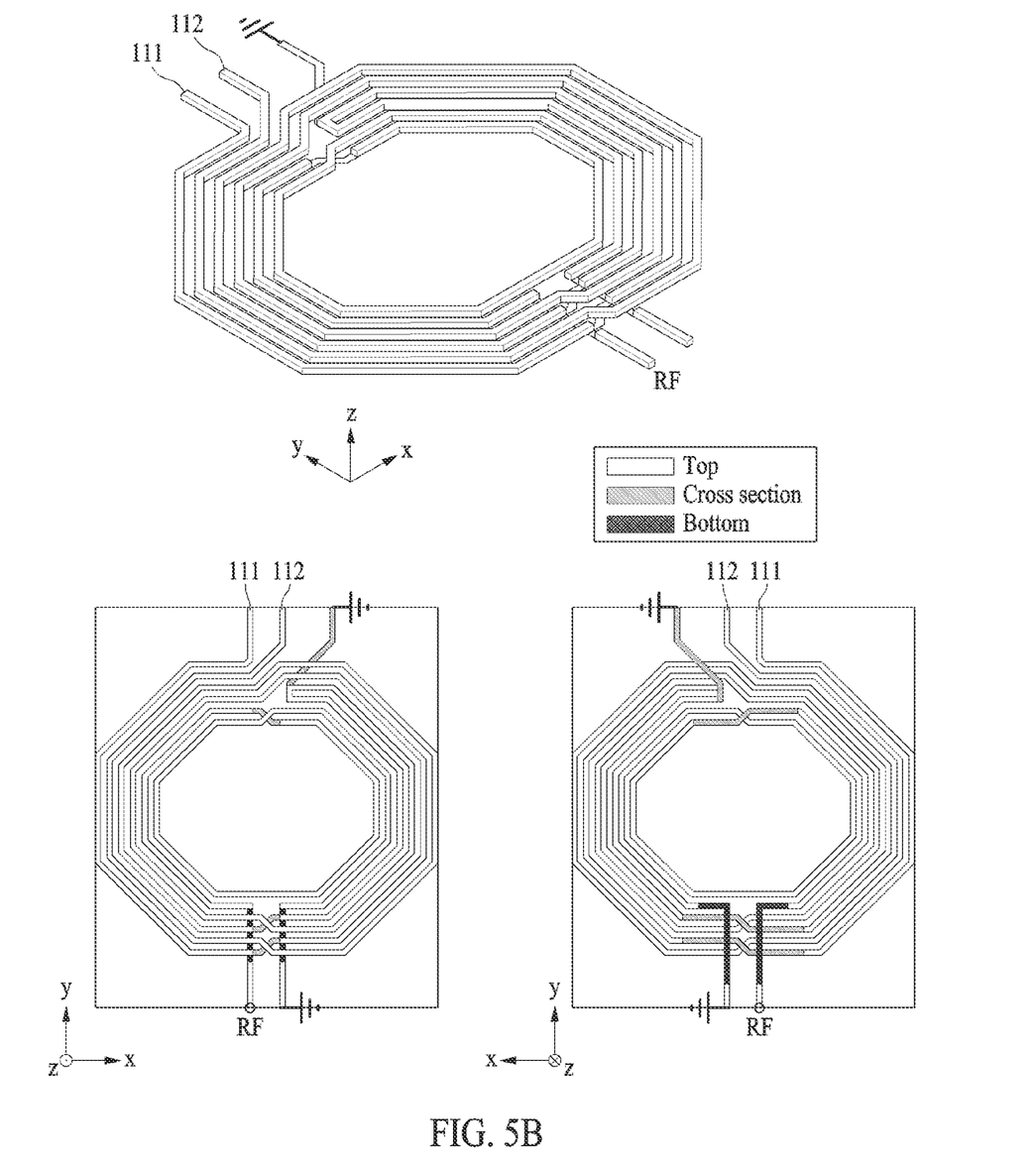
FIG. 5B is a diagram illustrating an example of a structure of a transformer in a passive mixer according to an example embodiment.

FIG. 5A is a diagram illustrating an example of an operation of a transformer in a passive mixer according to an example embodiment, and FIG. 5B is a diagram illustrating an example of a structure of a transformer in a passive mixer according to an example embodiment.

Referring to FIGS. 5A and 5B, a transformer may include a total of three inductors. The three inductors forming the transformer may be coupled by a broad side coupled method or an edge coupled method. An inductor S1 in FIG. 5A may correspond to the first inductor 121 in FIG. 1, and an inductor S2 in FIG. 5A may correspond to the second inductor 122 in FIG. 1. When a current flows through the first inductor 121 and the second inductor 122, the first inductor 121 and the second inductor 122 may be disposed in a direction to increase mutual inductance. Referring to FIG. 5A, a direction of an S1 magnetic flux by the S1 current and a direction of an S2 magnetic flux by the S2 current may coincide with each other.

Figure 6A:
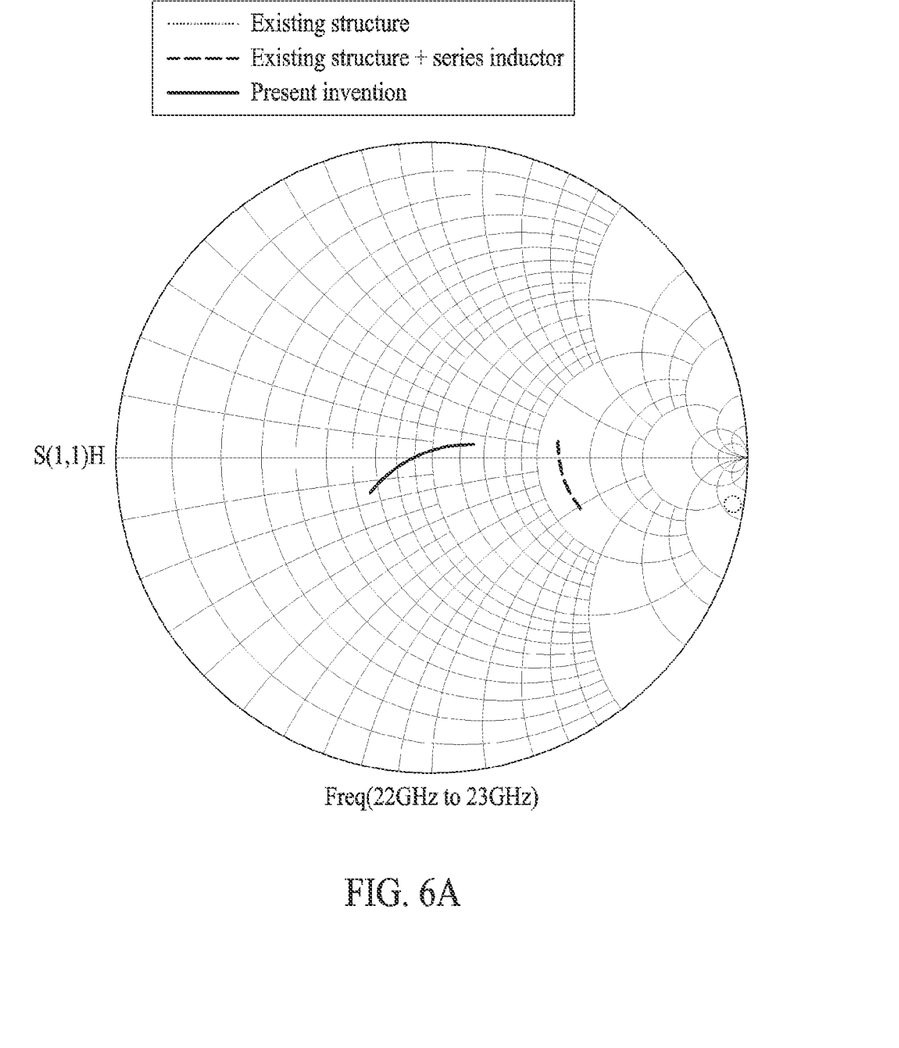
FIG. 6A is a diagram illustrating an example of input impedance matching of a passive mixer according to an example embodiment.

FIG. 6A is a diagram illustrating an example of a structure of a transformer in a passive mixer according to an example embodiment.

FIG. 6A illustrates an input impedance matching effect of the passive mixer 100 by comparing a typical passive mixer and a series inductor with the typical passive mixer.

A typical passive mixer may have an extremely large input impedance. An input impedance of the series inductor being added to the series inductor may be less than an input impedance of the typical passive mixer. The value of an inductance of the added series inductor may be of an extremely large. Adding the series inductor having an extremely large inductance value may increase an area of a chip and require additional space to maintain a self-resonance frequency. Adding a large-sized inductor may increase losses, thereby increasing NF and decreasing gain. A matching circuit by series LC resonance may have narrow band performance. The passive mixer 100 may use a transformer and set a turn ratio for the transformer. The passive mixer 100 may easily adjust the input impedance and have a wide band characteristic.

Figure 6B:
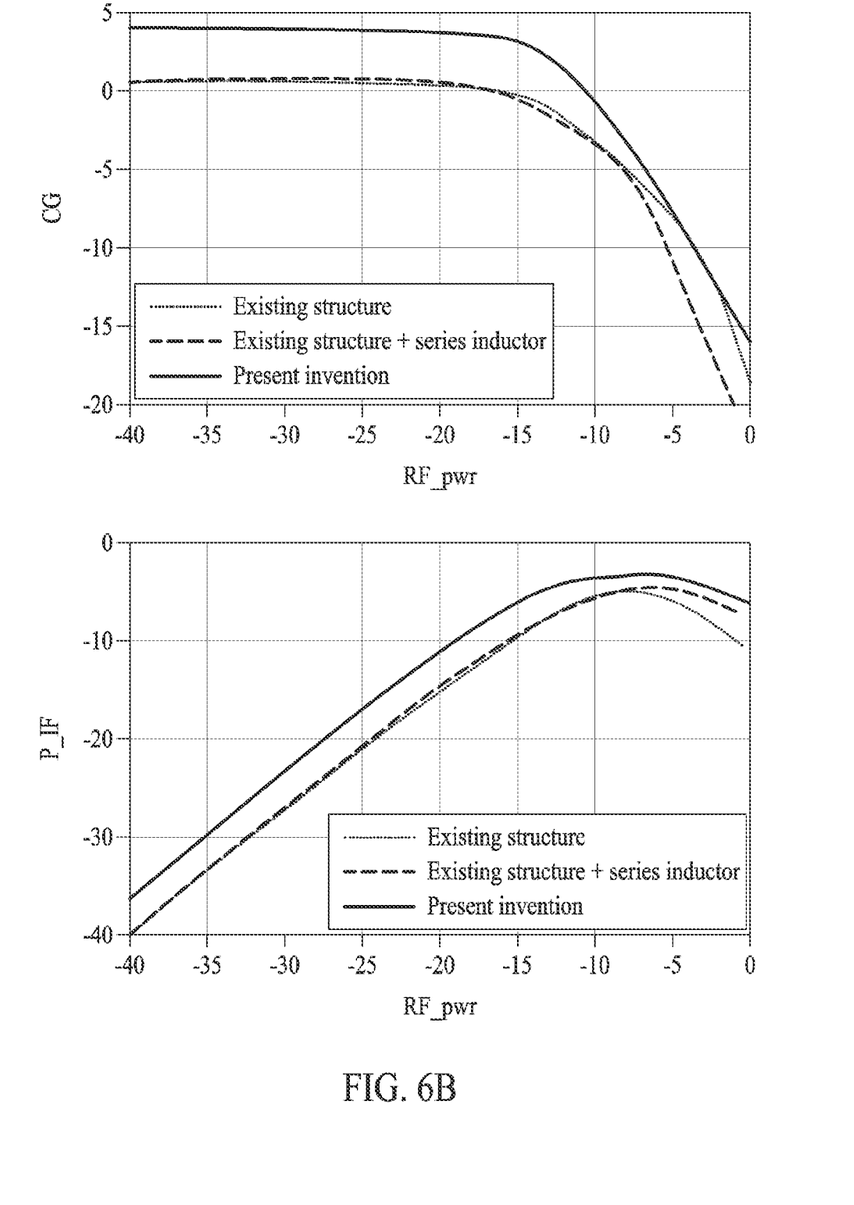
FIG. 6B is a diagram illustrating an example of gain and improved linearity of a passive mixer according to an example embodiment.

FIG. 6B is a diagram illustrating an example of improved gain and linearity of a passive mixer according to an example embodiment.

Referring to FIG. 6B, a typical passive mixer may have a gain of 1 decibel (dB) and an OP1dB close to −6 decibel-milliwatts (dBm). The gain of 1 dB and the OP1dB close to −6 dBm may be obtained by adding an inductor to the typical passive mixer. The passive mixer 100 may have a gain of 4 dB and an OP1dB close to −3 dBm.

The passive mixer 100 may better facilitate input impedance matching compared to the typical passive mixer. The passive mixer 100 may improve gain and linearity, and the passive mixer 100 may have wide band characteristics because a transformer is being used.

Figure 7:
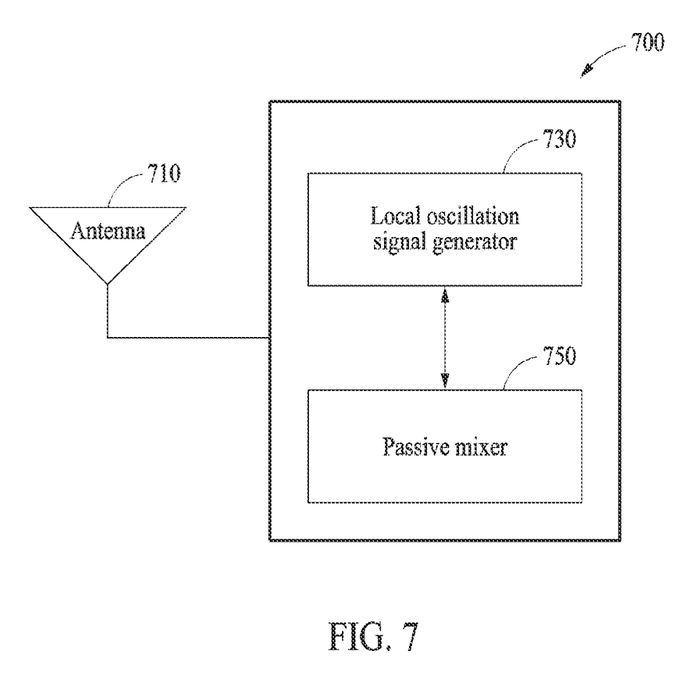
FIG. 7 is a diagram illustrating an example of a transceiver including a passive mixer according to an example embodiment.

FIG. 7 is a diagram illustrating an example of a transceiver including a passive mixer according to an example embodiment.

Referring to FIG. 7, a transceiver 700 may include an antenna 710, a local oscillation signal generator 730, and a passive mixer 750. The antenna 710 may receive a signal (e.g., RF signal). The local oscillation signal generator 730 may generate a local oscillation signal.

The passive mixer 750 may be the passive mixer 100 in FIG. 4. The passive mixer 750 may perform frequency down conversion in response to the local oscillation signal being generated by the local oscillation signal generator 730. A signal received by the transceiver 700 may be a standby signal or a signal amplified by a low noise amplifier. The transceiver 700 may be used as a frequency down converter in a system for transmitting and receiving a wireless signal. The transceiver 700 may have easy input impedance matching characteristics, improved gain and linearity, and wide band characteristics.

As described with reference to FIG. 7A, a communication device for transmitting and receiving an RF signal may include a passive mixer (e.g., the passive mixer 100 in FIG. 4). The communication device may process an atmospheric signal in a communication system or a sensor system (e.g., a radar) or a signal amplified by a low-noise amplifier.

The described hardware devices may be configured to act as one or more software modules in order to perform the operations of the above-described example embodiments, or vice versa.

While this disclosure includes example embodiments, it will be apparent to one of ordinary skill in the art that various changes in form and details may be made in these example embodiments without departing from the spirit and scope of the claims and their equivalents. The example embodiments described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A passive mixer, comprising:
    a differential transistor pair comprising a first transistor and a second transistor;
    a first inductor having one end connected to the first transistor and another end connected to a ground;
    a second inductor having one end connected to the second transistor and another end connected to the ground; and
    a third inductor having one end for receiving a radio frequency (RF) signal and another end connected to the ground.

2. The passive mixer of claim 1, wherein the first inductor, the second inductor, and the third inductor are each inductively coupled to each other such that three transformers are formed.

3. The passive mixer of claim 2, wherein the first inductor and the second inductor are disposed in a direction to increase a mutual inductance.

4. The passive mixer of claim 2, wherein the first inductor and the second inductor are equally wound in one of a clockwise direction and a counterclockwise direction.

5. The passive mixer of claim 1, further comprising:
    a gain stage configured to amplify the RF signal.

6. The passive mixer of claim 1, wherein the first inductor has the one end connected to a source terminal or a drain terminal of the first transistor.

7. The passive mixer of claim 1, wherein the second inductor has the one end connected to a source terminal or a drain terminal of the second transistor.

8. A passive mixer, comprising:
    a differential transistor pair;
    a ground node connected to a ground;
    an inductor having one end connected to an input terminal and another end connected to the ground node for receiving a radio frequency (RF) signal; and
    an additional inductor being magnetically coupled to the inductor such that a transformer is formed and having one end connected to at least one transistor of the differential transistor pair and another end connected to the ground node.

9. The passive mixer of claim 8, wherein the additional inductor comprises:
    a first additional inductor having a first end connected to a first transistor of the differential transistor pair and a second end connected to the ground node; and
    a second additional inductor having a third end connected to a second transistor of the differential transistor pair and a fourth end connected to the ground node.

10. The passive mixer of claim 9, wherein the first additional inductor and the second additional inductor are disposed in a direction to increase a mutual inductance.

11. The passive mixer of claim 9, wherein the first additional inductor and the second additional inductor are equally wound in one of a clockwise direction and a counterclockwise direction.

12. The passive mixer of claim 8, further comprising:
    a gain stage configured to amplify the RF signal.

13. The passive mixer of claim 9, wherein the first end is connected to a source terminal or a drain terminal of the first transistor.

14. The passive mixer of claim 9, wherein the third end is connected to a source terminal or a drain terminal of the second transistor.

15. A transceiver for transmitting and receiving a radio frequency (RF) signal, comprising:
    a local oscillator configured to generate a local oscillation signal; and
    a passive mixer configured to frequency down convert the RF signal in response to the local oscillation signal,
    wherein the passive mixer comprises:
        a differential transistor pair comprising a first transistor and a second transistor;
        a first inductor having one end connected to the first transistor and another end connected to a ground;
        a second inductor having one end connected to the second transistor and another end connected to the ground; and
        a third inductor having one end for receiving the RF signal and another end connected to the ground.

16. The transceiver of claim 15, wherein the first inductor, the second inductor, and the third inductor are each inductively coupled to each other such that three transformers are formed.

17. The transceiver of claim 16, wherein the first inductor and the second inductor are disposed in a direction to increase a mutual inductance.

18. The transceiver of claim 16, wherein the first inductor and the second inductor are equally wound in one of a clockwise direction and a counterclockwise direction.

19. The transceiver of claim 15, further comprising:
    a gain stage configured to amplify the RF signal.

20. The transceiver of claim 15, wherein the first inductor has the one end connected to a source terminal or a drain terminal of the first transistor.

* * * * *